(12) United States Patent
Kusaka

(10) Patent No.: US 9,453,872 B2
(45) Date of Patent: Sep. 27, 2016

(54) APPARATUS AND METHOD FOR POWER CYCLE TEST

(71) Applicant: ESPEC CORP., Osaka (JP)

(72) Inventor: Michiya Kusaka, Osaka (JP)

(73) Assignee: ESPEC CORP., Osaka (JP)

( * ) Notice: Subject to any disclaimer, the term of this patent is extended or adjusted under 35 U.S.C. 154(b) by 378 days.

(21) Appl. No.: 13/944,686

(22) Filed: Jul. 17, 2013

(65) Prior Publication Data
US 2014/0021973 A1 Jan. 23, 2014

(30) Foreign Application Priority Data

Jul. 18, 2012 (JP) .................................. 2012-159273

(51) Int. Cl.
G01R 31/26 (2014.01)
(52) U.S. Cl.
CPC ................................ *G01R 31/2619* (2013.01)
(58) Field of Classification Search
None
See application file for complete search history.

(56) References Cited

FOREIGN PATENT DOCUMENTS

| JP | 06-281693 A | 10/1994 |
|---|---|---|
| JP | 2000-074982 A | 3/2000 |
| JP | 2000-171491 A | 6/2000 |
| JP | 2003-130920 A | 5/2003 |
| JP | 2007-278910 A | 10/2007 |
| JP | 2012-088154 A | 5/2012 |

OTHER PUBLICATIONS

Japanese Office Action issued in corresponding Japanese Application No. 2012-159273, dated Mar. 24, 2015.
Japanese office Action issued in corresponding Japanese Application No. 2012-159273, dated Aug. 26, 2014.
Korean Office Action dated Nov. 7, 2014 issued in Korean Patent Application No. 10-2013-0079765.

*Primary Examiner* — Paresh Patel
(74) *Attorney, Agent, or Firm* — McDermott Will & Emery LLP

(57) ABSTRACT

Provided is a power cycle test apparatus that eliminates the need to measure a thermal resistance in a power cycle test and that pursues power saving in the evaluation of IGBT reliability by exactly applying a required thermal stress through the automatic adjustment of a stress current. The power cycle test apparatus performs a power cycle test for an IGBT to be tested by applying a thermal stress to the IGBT to be tested through the intermittent application of a stress current thereto. The apparatus applies the stress current to the IGBT to be tested and thereafter applies a current for measurement to the IGBT to be tested to measure a collector-emitter voltage of the IGBT to be tested. The apparatus further obtains a junction temperature of the IGBT to be tested from the measured collector-emitter voltage and a temperature coefficient of the IGBT to be tested.

8 Claims, 4 Drawing Sheets

APPARATUS AND METHOD FOR POWER CYCLE TEST

FIELD OF THE INVENTION

The invention relates to power cycle test apparatuses used to perform power cycle testing for IGBT (Insulated Gate Bipolar Transistor), and further relates to power cycle test methods for the purpose.

DESCRIPTION OF THE RELATED ART

The IGBT is conventionally used to supply high currents for devices such as inverters and motor drive circuits. The IGBT while in operation, therefore, generates a large volume of heat. When the IGBT is mounted on and bonded to a radiator plate with a solder and the solder in a part of the IGBT bonded to the radiator plate is repeatedly subjected to a thermal stress associated with the generated heat, the solder may undergo cracking. As the cracking further spreads, a thermal resistance becomes larger, making the release of heat from the junction difficult. In the end, the IGBT breaks down. The power cycle test is carried out to test the reliability of the IGBT. Describing the power cycle test, the application of a stress current, which is an electric load, to the IGBT and the suspension of the current application are repeated in turn to cause the junction temperature to accordingly rise and drop so that the thermal stress is applied to the IGBT (Patent Reference 1).

RELATED ART DOCUMENT

Patent Reference

[Patent Reference 1] JP Patent Application Publication No. 2012-088154

SUMMARY OF THE INVENTION

Problems to be Solved by the Invention

To test the reliability of IGBT, it is desirable to measure the junction temperature to detect any temperature changes. However, it is not possible to directly measure the junction temperature. Therefore, the thermal resistance is measured with a dedicated thermal resistance gauge after the power cycle test for the IGBT is completed. Then, it is determined whether the IGBT has been degraded depending on a degree of change of the thermal resistance from its initial value to evaluate the IGBT reliability. Thus, a problem with the conventional technique is the necessity of measuring the thermal resistance, which increases the evaluation cost and evaluation time of the IGBT reliability.

In the power cycle test conventionally performed, a management point for a junction temperature difference of the IGBT is set, and the stress current is applied in predefined cycles in an on-and-off manner correspondingly to the management point. Then, the IGBT reliability is evaluated based on any changes of the IGBT junction temperature from the management point. Due to the fact that the IGBT thermal resistance variable with time may be different every time when the power cycle test is performed, it is necessary to apply the thermal stress by manually suitably adjusting the stress current so that the junction temperature difference is equal to the management point for each power cycle test. Hence, it is conventionally not possible to exactly apply a required thermal stress or pursue power saving in the reliability evaluation.

The invention is aimed at eliminating the need to measure the thermal resistance for the IGBT reliability evaluation after the power cycle test. The invention provides a power cycle test apparatus and a power cycle test method that succeed in power saving of the IGBT reliability evaluation, wherein the stress current is automatically suitably adjustable so that a required thermal stress is exactly applied to the IGBT.

Means for Solving Problems

A power cycle test apparatus according to a first aspect of the invention is a power cycle test apparatus for performing a power cycle test for an IGBT to be tested by applying a thermal stress to the IGBT to be tested through the intermittent application of a stress current thereto. The power cycle test apparatus comprises: a current source for applying the current to the IGBT to be tested; and a controller for controlling the power cycle test apparatus. The controller applies the stress current to the IGBT to be tested by controlling the current source and thereafter applies a current for measurement to the IGBT to be tested to measure a collector-emitter voltage of the IGBT to be tested. Further, the controller calculates a junction temperature of the IGBT to be tested from the measured collector-emitter voltage and a temperature coefficient of the IGBT to be tested.

Preferably, the controller obtains by arithmetic processing the temperature coefficient from a temperature change of the IGBT to be tested and a change of the collector-emitter voltage of the IGBT to be tested resulting from the temperature change.

Preferably, after the stress current is applied to the IGBT to be tested, the controller applies a first current for measurement to the IGBT to be tested to measure the collector-emitter voltage of the IGBT to be tested and then applies a second current for measurement higher than the first current for measurement to the IGBT to be tested to measure the collector-emitter voltage of the IGBT to be tested immediately after the second current for measurement is applied thereto.

Preferably, the first current for measurement is a constant current.

Preferably, the power cycle test apparatus further includes another IGBT to be tested or an IGBT for control, each of which has the collector-emitter electrodes respectively connected in series to the collector-emitter electrodes of the IGBT to be tested. The controller turns on the another IGBT to be tested or the IGBT for control to form a current application path for the stress current or the second current for measurement in the IGBT to be tested. The controller turns off the another IGBT to be tested or the IGBT for control to block the current application path.

Preferably, the power cycle test apparatus further includes a heating and cooling unit for heating or cooling the IGBT to be tested to cause the temperature change in the IGBT to be tested.

Preferably, the controller controls the stress current to be applied to the IGBT to be tested using a junction temperature difference as a management point, the junction temperature difference being a difference between junction temperatures in a temperature rise and a temperature fall of the IGBT to be tested in the power cycle test. The controller automatically adjusts the stress current based on the junction temperature difference. The junction temperature difference is calculated utilizing the junction temperature so that the junction temperature difference becomes equal to the management point.

Preferably, the controller obtains a plurality of junction temperature differences of the IGBT to be tested along with passage of time from an applied power obtained from an applied current and an applied voltage for the IGBT to be tested, a voltage change of the collector-emitter voltage of the IGBT to be tested, and the temperature coefficient of the IGBT to be tested, and the controller measures a thermal resistance of the IGBT to be tested in a manner that corresponds to the obtained plurality of junction temperature differences.

A power cycle test apparatus according to a second aspect of the invention is a power cycle test apparatus for performing a power cycle test for an IGBT to be tested by applying a thermal stress to the IGBT to be tested through the application of a stress current thereto in an on-and-off manner. The power cycle test apparatus includes: a current source for applying the current to the IGBT to be tested; another IGBT to be tested or an IGBT for control, each having collector-emitter electrodes respectively connected in series to the collector-emitter electrodes of the IGBT to be tested; and a controller for controlling the power cycle test apparatus. The controller applies the stress current from the current source to the IGBT to be tested and thereafter applies a current for measurement to the IGBT to be tested to measure a collector-emitter voltage of the IGBT to be tested. Further, the controller obtains by arithmetic processing a junction temperature of the IGBT to be tested from the measured collector-emitter voltage and a temperature coefficient of the IGBT to be tested previously obtained by arithmetic processing, and the controller turns on the another IGBT to be tested or the IGBT for control to form a current application path for the stress current in the IGBT to be tested, and the controller turns off the another IGBT to be tested or the IGBT for control to block the current application path.

A power cycle test method according to a third aspect of the invention is a power cycle test method for performing a power cycle test for an IGBT to be tested by applying a thermal stress to the IGBT to be tested through the intermittent application of a stress current thereto. The power cycle test method comprises: a first step in which the stress current is applied to the IGBT to be tested and a current for measurement is thereafter applied to the IGBT to be tested to measure a collector-emitter voltage of the IGBT to be tested; and a second step in which a junction temperature of the IGBT to be tested is operated based on from the measured collector-emitter voltage and a temperature coefficient of the IGBT to be tested.

Effect of the Invention

The invention eliminates the need to measure a thermal resistance using a thermal resistance gauge externally provided after the power cycle test in order to evaluate the IGBT reliability.

The invention can exactly apply a required thermal stress to the IGBT in a power cycle test through the automatic adjustment of a stress current, thereby accomplishing power saving in the power cycle test.

MODE FOR CARRYING OUT THE INVENTION

A power cycle test apparatus and a power cycle test method according to an embodiment of the invention are described in detail referring to the accompanying drawings.

Figure 1:
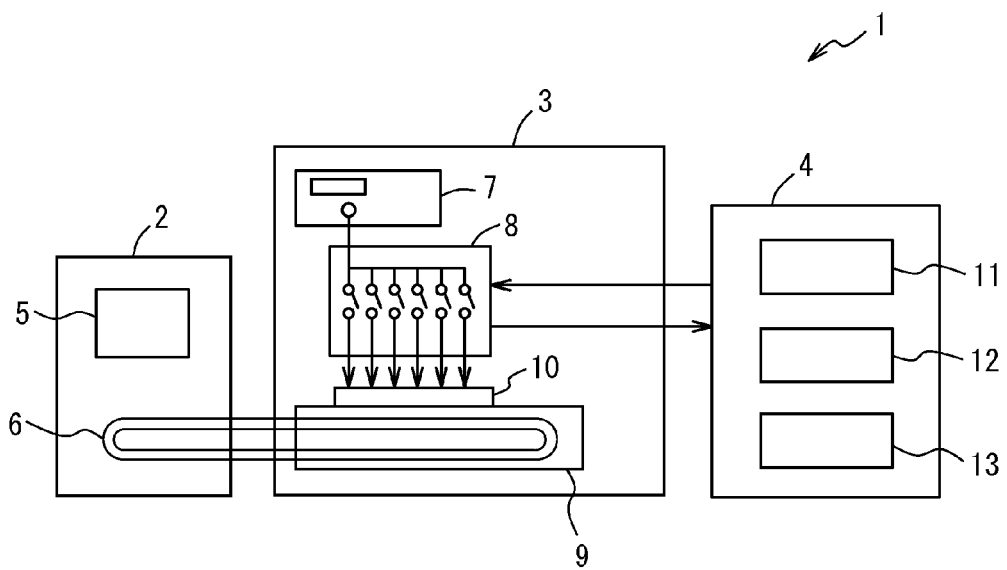
FIG. 1 is a block diagram illustrating a power cycle test apparatus according to an embodiment of the invention.
Figure 2:
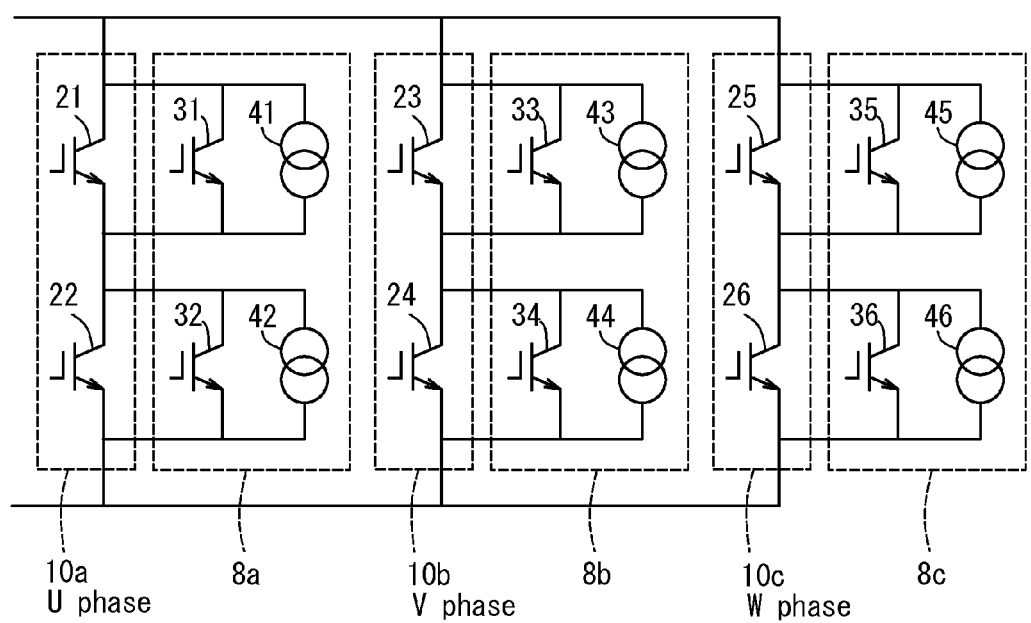
FIG. 2 is a circuit connection diagram, illustrating UVW three-phase IGBTs for test to be subjected to a power cycle test, IGBTs for control, and constant current sources.

First, the power cycle test apparatus according to the embodiment is described referring to FIGS. 1 and 2. A power cycle test apparatus 1 according to the embodiment has a chiller 2, a test unit 3, and a control rack 4. The chiller 2 has a water temperature management unit 5 and a water circulation pipe 6. The temperature of water in the water circulation pipe 6 is controlled by the water temperature management unit 5 to stay in the range of minus 10° C. to plus 100° C. The temperature-controlled water is supplied to the test unit 3.

The test unit 3 includes a current source 7 that applies a current to IGBTs for test 21 to 26, a power device for control 8 that controls whether a stress current is applied to the IGBTs for test 21 to 26 or the application of the stress current is suspended, and a heating and cooling plate 9 for heating or cooling the IGBTs for test. A power device for test 10 including a circuit connection illustrated in FIG. 2 is mounted on the heating and cooling plate 9.

The power device for test 10 includes the UVW-phase IGBTs for test 21 to 26 illustrated in FIG. 2. The power device for test 10 is heated or cooled down by the heating and cooling plate 9. A stress current Is and a second current for measurement Im2 from the current source 7 are applied to the power device for test 10, as described later.

The control rack 4 includes a controller 11 including a computer, a gate timing unit 12, and a voltage measuring unit 13. The gate timing unit 12 decides timings of applying an ON/OFF gate voltage to the IGBTs for test 21 to 26 and IGBTs for control 31 to 36 (illustrated in FIG. 2). The voltage measuring unit 13 measures collector-emitter voltages of the UVW-phase IGBTs for test 21 to 26.

The controller 11 controls the timings of applying the gate voltage by controlling the gate timing unit 12 and controls input of the voltages measured by the voltage measuring unit 13.

In response to commands of a control program, the controller 11 controls: input of temperatures on case surfaces of the IGBTs for test 21 to 26 measured by a temperature sensor not illustrated in the drawings, for example, a thermocouple; the water temperature management unit 5 of the chiller 2; and arithmetic processing and measuring operations described later referring to different data tables.

The controller 11 controls the temperature of water in the water circulation pipe 6 by controlling the water temperature management unit 5 of the chiller 2 and feeds the heating and cooling plate 9 with the temperature-controlled water. The controller 11 controls the gate timing unit 12 and thereby controls ON/OFF timings of the UVW-phase IGBTs for test 21 to 26 in the power device for test 10 and the IGBTs for control 31 to 36 in the power device for control 8. The controller 11 controls the voltage measuring unit 13 and thereby measures the collector-emitter voltages of the IGBTs for test 21 to 26. The controller 11 obtains a temperature coefficient described later by arithmetic processing and also executes arithmetic processes described later based on the collector-emitter voltages measured by the voltage measuring unit 13.

The IGBTs 21 to 26 illustrated in FIG. 2 are high-side and low-side IGBTs for test, and they are respectively UVW-phase IGBTs where collector-emitter electrodes are serially connected. The whole IGBTs for test 21 to 26 are mounted on the heating and cooling plate 9 and provided as the power device for test 10 which is an example of three-phase inverters.

In the circuit connection diagram of FIG. 2, the power device for test 10 includes a U-phase power device unit for test 10a having the high-side and low-side IGBTs for test 21 and 22, a V-phase power device unit for test 10b having the high-side and low-side IGBTs for test 23 and 24, and a W-phase power device unit for test 10c having the high-side and low-side IGBTs for test 25 and 26.

The collector-emitter electrodes of the IGBTs for control 31 and 32 are respectively connected in parallel to between the collector-emitter electrodes of the IGBTs for test 21 and 22 of the U-phase power device unit for test 10a. The collector-emitter electrodes of the IGBTs for control 33 and 34 are respectively connected in parallel to between the collector-emitter electrodes of the IGBTs for test 23 and 24 of the V-phase power device unit for test 10b. The collector-emitter electrodes of the IGBTs for control 35 and 36 are respectively connected in parallel to between the collector-emitter electrodes of the IGBTs for test 25 and 26 of the W-phase power device unit for test 10c.

Similarly, constant current sources 41 and 42 are respectively connected in parallel to between the collector-emitter electrodes of the IGBTs for test 21 and 22 of the U-phase power device unit for test 10a, constant current sources 43 and 44 are respectively connected in parallel to between the collector-emitter electrodes of the IGBTs for test 23 and 24 of the V-phase power device unit for test 10b, and constant current sources 45 and 46 are respectively connected in parallel to between the collector-emitter electrodes of the IGBTs for test 25 and 26 of the W-phase power device unit for test 10c.

The power device for control 8 includes the IGBTs for control 31 to 36 and the constant current sources 41 to 46. The IGBTs for control 31 and 32 and the constant current sources 41 and 42 constitute a U-phase power device unit for control 8a. The IGBTs for control 33 and 34 and the constant current sources 43 and 44 constitute a V-phase power device unit for control 8b. The IGBTs for control 35 and 36 and the constant current sources 45 and 46 constitute a W-phase power device unit for control 8c.

The constant current sources 41 to 46 respectively supply a constant current of approximately 1 mA to the IGBTs for test 21 to 26 as a first current for measurement Im1 as described later. In the IGBTs for test 21 to 26 driven by the constant current, however, heat thereby generated is negligibly small, and junction temperatures change in a manner similar to temperature changes of case surfaces caused by the heating or cooling by the heating and cooling plate 9.

The power cycle test performed by the power cycle test apparatus 1 is hereinafter described referring to FIGS. 3 to 6. In the description given below, the power cycle test is performed for the U-phase high-side IGBT for test 21. According to the embodiment, there are two test modes A and B, and the controller 11 of the control rack 4 executes the arithmetic processes, measurements, and controls in the respective test modes. A common prerequisite in these test modes A and B is to obtain the temperature coefficient of the IGBT for test 21 by arithmetic processing.

Figure 3:
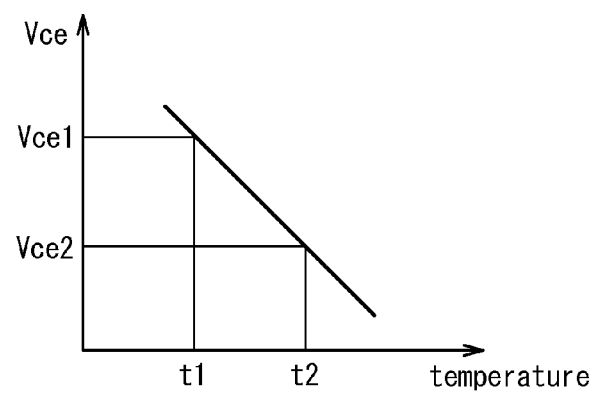
FIG. 3 is a graph illustrating the arithmetic processing of a temperature coefficient of IGBT for test, where the lateral axis represents temperature and the longitudinal axis represents a collector-emitter voltage Vce.

The arithmetic processing of the temperature coefficient of the IGBT for test 21 is described below referring to FIG. 3.

The controller 11 controls the gate timing unit 12 and thereby turns on the IGBT for test 21 at a constant gate voltage Vg, and applies the first current for measurement Im1 from the constant current source 41 to between the collector-emitter electrodes of the IGBT for test 21. Then, the controller 11 controls the chiller 2 and thereby heats or cools the IGBT for test 21 using the heating and cooling plate 9. The controller 11 then obtains by arithmetic processing a temperature coefficient K ($=\Delta Tj/\Delta Vce$) from a temperature change $\Delta Tj$ ($=t1-t2$) and a collector-emitter voltage change $\Delta Vce$ ($=Vce1-Vce2$) as illustrated in FIG. 3.

The first current for measurement Im1 supplied from the constant current source 41 is a very low current, and a case surface temperature Tc of the IGBT for test 21 is substantially equal to a junction temperature Tj. Therefore, changes of the case surface temperature Tc as heated or cooled by the heating and cooling plate 9 are regarded as changes of the junction temperature Tj, and measured values t1 and t2 of the junction temperature changes are inputted and used in the arithmetic processing. Further, measured values Vce1 and Vce2 of the collector-emitter voltage of the IGBT for test 21 are inputted from the voltage measuring unit 13 and used in the arithmetic processing.

[Test Mode A]

Figure 5A:
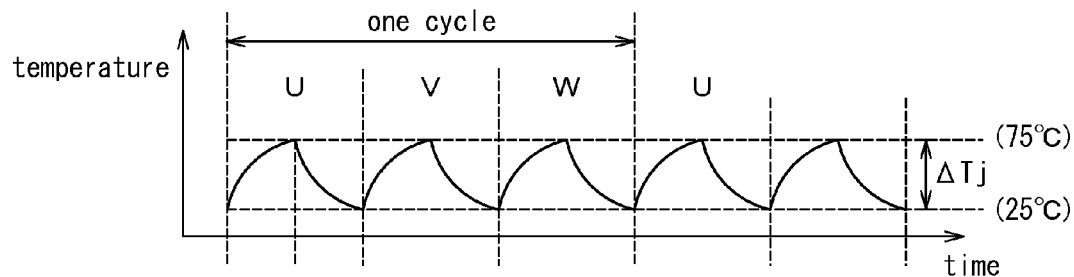
FIG. 5a illustrates junction temperatures of the UVW three-phase IGBTs in the power cycle test, where the lateral axis represents time and the longitudinal axis represents the junction temperatures.
Figure 5B:
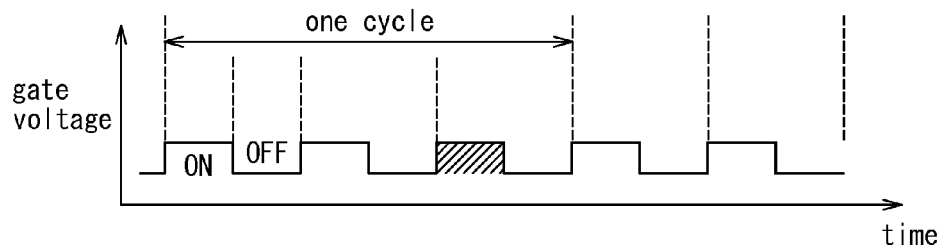
FIG. 5b illustrates a gate voltage (ON/OFF timing) in the UVW three-phase IGBTs for test in the power cycle test, where the lateral axis represents time and the longitudinal axis represents the gate voltage.

In the power cycle test performed in the test mode A, the application of the stress current Is to the gate of the IGBT for test 21 and the suspension of the current application are repeated in turn by ON/OFF timings of the gate voltage Vg illustrated in FIG. 5b.

In the power cycle test thus performed, the junction temperature Tj of the IGBT for test 21 rises and falls as illustrated in FIG. 5a, and $\Delta Tj$ is a temperature difference between the rise and fall of the junction temperature Tj.

After the power cycle test is over, the application of the stress current Is is stopped and the IGBT for test 21 cools down enough.

Then, the first current for measurement Im1 from the constant current source 41 is applied to the cooled-down IGBT for test 21.

The IGBT for test 21 has cooled down enough by the time when the first current for measurement Im1 is applied thereto. Hence, the collector-emitter voltage Vce of the IGBT for test 21 should correspond to the junction temperature Tj at a low degree.

Thus, the collector-emitter voltage Vce then is estimated to be equal to the junction temperature Tj when the junction temperature of the IGBT for test 21 is low.

The junction temperature Tj is substantially equal to the case surface temperature Tc of the IGBT for test 21.

Then, the second current for measurement Im2 higher than the first current for measurement Im1 is applied to the IGBT for test 21 so that the junction temperature Tj is elevated to a certain high degree.

The second current for measurement Im2 is different to the stress current Is. When the second current for measurement Im2 is applied to the IGBT for test 21, the junction temperature Tj of the IGBT is elevated to a certain high degree.

While the junction temperature Tj is still high immediately after the second current for measurement Im2 is applied, the current to be applied to the IGBT for test 21 is switched to the first current for measurement Im1 from the constant current source 41, and the collector-emitter voltage Vce of the IGBT for test 21 corresponding to the junction temperature Tj at a high degree is measured.

The collector-emitter voltage Vce of the IGBT for test 21 is measured immediately after the second current for measurement Im2 is applied thereto because the IGBT for test 21 starts to cool down as soon as the application of the second current for measurement Im2 to the IGBT for test 21 is stopped, and the junction temperature Tj accordingly drops rapidly. Therefore, it is necessary to measure the collector-emitter voltage Vce before the junction temperature Tj starts to drop.

In the test mode A, the junction temperature Tj of the IGBT for test may change, whereas no changes occur in the value of the stress current Is, current application time, and suspension time (ON and OFF times illustrated in FIG. 5b).

The controller 11 controls the test operation in the test mode A.

The processing steps for measurement in the test mode A are described in detail below.

Figure 4:
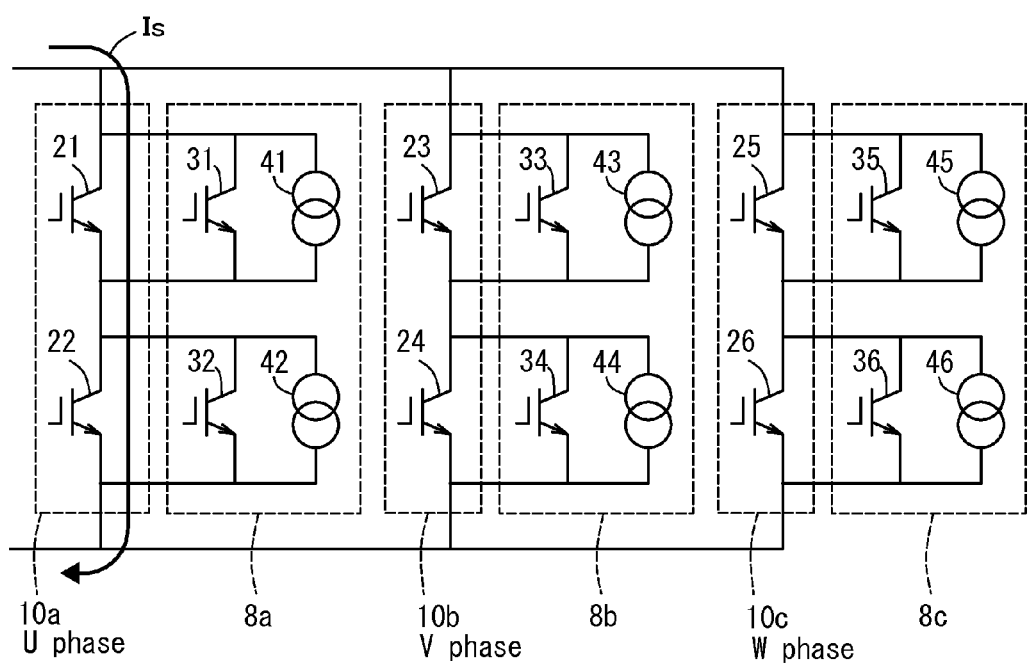
FIG. 4 is a circuit connection diagram similar to FIG. 2, illustrating a state where a stress current is being applied to the U-phase high-side and low-side IGBTs for test.

(1a) The power cycle test is performed, in which the application of the stress current to the IGBT for test and the suspension of the current application are repeated in turn (see FIGS. 4 and 5).

As illustrated with an arrow Is in FIG. 4, the controller 11 controls the gate timing unit 12 and thereby applies the stress current Is to the IGBTs for test 21 and 22 of the U-phase power device unit for test 10a. FIG. 5a illustrates changes of the junction temperatures in the IGBTs for test 21 to 26 through the application of the stress current Is and the suspension of the current application repeatedly performed. FIG. 5b illustrates ON/OFF wave patterns of the gate voltages of the IGBTs for test 21 to 26 in the UVW-phase power device units 10a, 10b, and 10c.

(2a) After the application of the stress current Is to the IGBT for test 21 is stopped, the test operation waits until the junction of the IGBT for test cools down enough.

Figure 6:
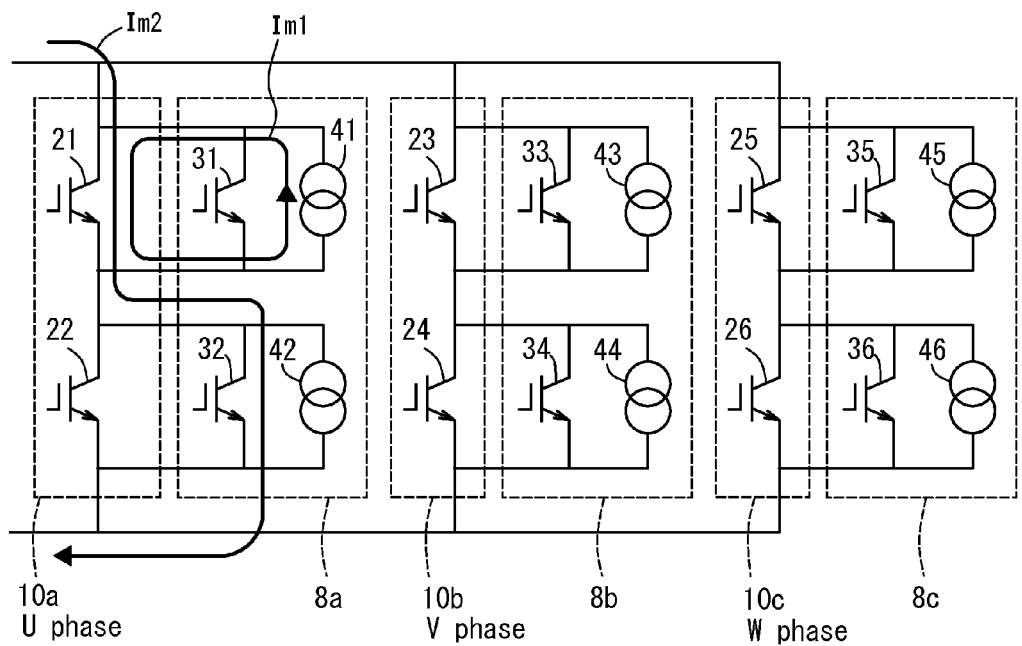
FIG. 6 is a circuit connection diagram similar to FIG. 2, illustrating a state where a current is being applied to the U-phase high-side IGBT for test and the low-side IGBT for control to measure a collector-emitter voltage difference $\Delta Vce$ of the IGBT for test.

(3a) Next, the gate timing unit 12 is controlled to turn on the IGBT for test 21, and the first current for measurement Im1 from the constant current source 41 is applied to the IGBT for test 21 as illustrated with an arrow Im1 in FIG. 6. The collector-emitter voltage Vce of the IGBT for test 21 during the application of the first current for measurement Im1 is measured, and the low-degree junction temperature Tj of the IGBT for test 21 is estimated from the measured collector-emitter voltage Vce.

(4a) Next, the second current for measurement Im2 is applied to the IGBT for test 21 as illustrated with an arrow Im2 in FIG. 6. The controller 11 turns on the IGBT for test 21 and the IGBT for control 32 by controlling the gate timing unit 12 and applies the second current for measurement Im2 to the IGBT for test 21.

(5a) Next, the IGBT for control 32 is turned off, and the application of the second current for measurement Im2 to the IGBT for test 21 is stopped. Immediately after the application of the second current for measurement Im2 is stopped, the first current for measurement Im1 from the constant current source 41 is applied to the IGBT for test 21. The controller 11 measures the collector-emitter voltage Vce of the IGBT for test 21 at the time. The collector-emitter voltage Vce measured then corresponds to the high-degree junction temperature Tj of the IGBT for test 21.

(6a) Then, the junction temperature Tj of the IGBT for test 21 is estimated. In the described example, the high-degree junction temperature Tj can be estimated from the temperature coefficient K and the collector-emitter voltage Vce of the IGBT for test 21 corresponding to the high-degree junction temperature Tj in (5a).

The junction temperature difference $\Delta Tj$ can be obtained by arithmetic processing from the low-degree junction temperature Tj in (3a) and the high-degree junction temperature Tj in (5a)

[Test Mode B]

In the test mode B, similarly to the test mode A, the high-degree junction temperature Tj of the IGBT for test 21 is obtained through the application of the stress current and the suspension of the current application. The current value or the current application time of the stress current Is to be applied are controlled so that the junction temperature Tj of the IGBT for test 21 is kept at the same degree as the high-degree junction temperature Tj.

In the test mode B, the application of the second current for measurement Im2 is omitted. Immediately after the application of the stress current Is is suspended, the first current for measurement Im1 is applied to the IGBT for test 21 as illustrated with the arrow Im1 in FIG. 6. The test mode B is a test mode in which the collector-emitter voltage Vce of the target IGBT for test is measured, and the high-degree junction temperature Tj of the target IGBT for test is estimated from the measured value of the voltage Vce and the temperature coefficient K. The controller 11 controls the test operation in the test mode B.

The processing steps for measurement in the test mode B are described in detail below.

(1b) The stress current Is is applied to the IGBT for test 21.

(2b) As illustrated with the arrow Im1 in FIG. 6, the first current for measurement Im1 from the constant current source 41 is applied to the IGBT for test 21 immediately after the application of the stress current Is is stopped, and the collector-emitter voltage Vce at the time is measured. The voltage measured then, which is a voltage immediately after the application of the stress current Is is stopped, is a voltage when the junction temperature Tj is high.

(3b) The high-degree junction temperature Tj is estimated from the temperature coefficient K, and the collector-emitter voltage Vce when the junction temperature Tj is high.

(4b) The current value or the current application time of the stress current Is to be applied are controlled so that the estimated high-degree junction temperature Tj is constantly obtained.

Because of such an OFF time that allows the junction of the IGBT for test 21 to be cooled down enough, the low-degree junction temperature Tj is regarded to be equal to a plate temperature.

In the test mode B of the power cycle test, when the low-degree junction temperature of the IGBT for test 21 is 25° C. and the high-degree junction temperature of the IGBT for test 21 is 75° C., the junction temperature difference ΔTj at the management point is 50 degrees.

The power cycle test is performed in, for example, one cycle, and the high-degree junction temperature Tj is estimated and the junction temperature difference ΔTj is obtained by arithmetic processing from the low-degree junction temperature Tj and the high-degree junction temperature Tj. In the case of any change of the junction temperature difference ΔTj thus obtained from 50 degrees at the management point, the controller 11 automatically adjusts the stress current Is and thereby applies a required thermal stress correspondingly to the management point.

Thus, the stress current Is is automatically adjusted by the controller 11, and the required thermal stress is exactly applied to the IGBT for test 21 in the power cycle test.

Figure 7:
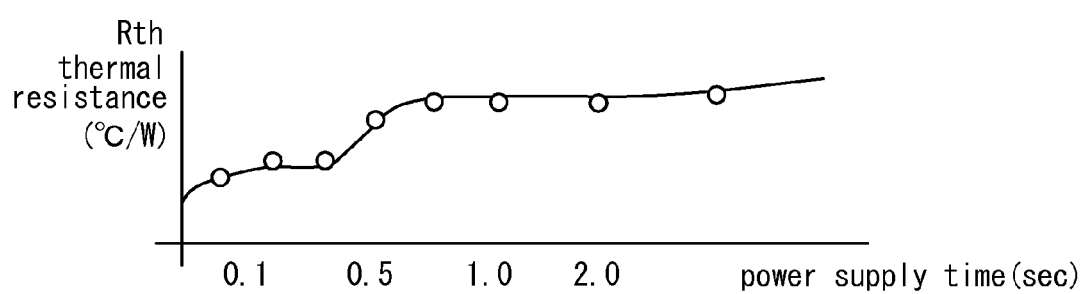
FIG. 7 is a graph where the lateral axis represents time domains of power supply and the longitudinal axis represents thermal resistances Rth (° C./W).

A plurality of temperature differences ΔTj in the junction temperature Tj of the IGBT for test 21 may be obtained in different time domains from an applied power P obtained from the applied current and the applied voltage for the IGBT for test 21, and a collector-emitter voltage change ΔVce and the temperature coefficient K of the IGBT for test 21. Then, as illustrated in FIG. 7, a thermal resistance of the IGBT for test 21 is measured on a graph where the lateral axis represents the time domains of power supply and the longitudinal axis represents thermal resistances Rth (° C./W) corresponding to the junction temperature differences ΔTj obtained in the respective time domains. This helps to locate any possibly malfunctioning part of the IGBT for test 21.

The power cycle test apparatus according to the embodiment has a function of obtaining the temperature coefficient K of the IGBT for test 21. However, the invention is applicable to power cycle test apparatuses not equipped with the function of obtaining the temperature coefficient K. For example, the collector-emitter voltage Vce of the IGBT for test 21 is measured after the stress current Is is applied to the IGBT for test 21, and the junction temperature Tj of the IGBT for test 21 is obtained by arithmetic processing from the measured collector-emitter voltage Vce and the temperature coefficient K of the IGBT for test 21 obtained beforehand by arithmetic processing.

According to the embodiment, UVW-phase IGBTs with six circuit elements (6in1) are used as an example of test objects. However, the test object may be other IGBTs differently configured such IGBT with one circuit element (2 in1).

In each power device unit for test described in the embodiment, the collector-emitter electrodes of the high-side and low-side IGBTs for test are serially connected, and the collector-emitter electrodes of the IGBTs for control are connected in parallel to between the collector-emitter electrodes of the IGBTs for test. The invention, however, is not limited thereto. The power device units for test may each include one IGBT for test, wherein a collector-emitter of an IGBT for control is serially connected to a collector and an emitter of the IGBT for test to carry out the measurements described so far.

In each power device unit for test described in the embodiment, the collector-emitter electrodes of the high-side and low-side IGBTs for test are serially connected, and the collector-emitter electrodes of the IGBTs for control are connected in parallel to between the collector-emitter electrodes of the IGBTs for test. The invention, however, is not limited thereto. Instead of providing or using the IGBTs for control, one of the high-side and low-side IGBTs for test is used as a test object, while the other IGBT for test is used as an IGBT for control to carry out the measurements described so far.

According to the embodiment, the second current for measurement Im2 is applied to the IGBT for test and the collector-emitter voltage Vce of the IGBT for test is then measured in the test mode A, whereas the collector-emitter voltage Vce of the IGBT for test is measured without applying the second current for measurement Im2 to the IGBT for test in the test mode B. The invention is not necessarily limited to the combination of these test modes where the respective processing steps for measurement are carried out. The test may be performed in any other appropriate manner.

According to the embodiment, the heating and cooling plate 9 is used for heating and cooling. A thermal/cooling source may be used in place of the cooling plate, or a thermal source and a cooling source may be separately provided respectively for heating and cooling.

DESCRIPTION OF REFERENCE NUMERALS

1 power cycle test apparatus
2 chiller
5 water temperature management unit
6 water circulation pipe
3 test unit
7 current source
8 power device for control
9 heating and cooling plate
10 power device for test
4 control rack
11 personal computer for apparatus control
12 gate timing unit
13 voltage measuring unit
21-26 IGBT for test
31-36 IGBT for control
41-46 constant current source

The invention claimed is:
1. A power cycle test apparatus for performing a power cycle test for an IGBT to be tested by applying a thermal stress to the IGBT to be tested through the intermittent application of a stress current thereto,
the power cycle test apparatus comprising:
a current source for applying an electrical current to the IGBT to be tested;
a second current source connected in parallel to the IGBT to be tested;
another IGBT to be tested having collector-emitter electrodes connected in series to collector-emitter electrodes of the IGBT to be tested;
an IGBT for control connected in parallel to the another IGBT to be tested; and
a controller for controlling the power cycle test apparatus,
wherein the controller applies the stress current to the IGBT to be tested from the current source by turning on the another IGBT to be tested and turning off the IGBT for control, and thereafter the controller applies a current for measurement from the second current source to the IGBT to be tested by turning off the another IGBT to be tested and measures a collector-emitter voltage of the IGBT to be tested, the controller applies a second current for measurement from the current source to the IGBT to be tested by turning off the another IGBT to be tested and turning on the IGBT for control and measures the collector-emitter voltage of the IGBT to be tested immediately after the application of the second current for measurement is stopped, and the controller operates a junction temperature of the IGBT to be tested from the measured collector-emitter voltage and a temperature coefficient of the IGBT to be tested.

2. The power cycle test apparatus as claimed in claim 1, wherein the controller operates the temperature coefficient based on a temperature change of the IGBT to be tested and a change of the collector-emitter voltage of the IGBT to be tested resulting from the temperature change.

3. The power cycle test apparatus as claimed in claim 1, wherein after the application of the stress current to the IGBT to be tested, the controller applies a first current for measurement to the IGBT to be tested to measure the collector-emitter voltage of the IGBT to be tested, applies a second current for measurement higher than the first current for measurement, and measures the collector-emitter voltage of the IGBT to be tested immediately after the second current for measurement is applied thereto.

4. The power cycle test apparatus as claimed in claim 3, wherein the first current for measurement is a constant current low enough to make heat generated by the IGBT to be tested negligibly small.

5. The power cycle test apparatus as claimed in claim 2, wherein the power cycle test apparatus further includes a heating and cooling unit for heating or cooling the IGBT to be tested to cause the temperature change in the IGBT to be tested.

6. The power cycle test apparatus as claimed in claim 1, wherein the controller controls the stress current to be applied to the IGBT to be tested using a junction temperature difference as a management point, the junction temperature difference being a difference between junction temperatures in a temperature rise and a temperature fall of the IGBT to be tested in the power cycle test, and the controller automatically adjusts the stress current based on the junction temperature difference operated utilizing the junction temperature so that the junction temperature difference becomes equal to the management point.

7. The power cycle test apparatus as claimed in claim 1, wherein the controller obtains a plurality of junction temperature differences of the IGBT to be tested along with passage of time from an applied power obtained from an applied current and an applied voltage for the IGBT to be tested, a voltage change of the collector-emitter voltage of the IGBT to be tested, and the temperature coefficient of the IGBT to be tested, and the controller measures a thermal resistance of the IGBT to be tested in a manner that corresponds to the obtained plurality of junction temperature differences.

8. A power cycle test apparatus for performing a power cycle test for an IGBT to be tested by applying a thermal stress to the IGBT to be tested through the application of a stress current thereto in an on-and-off manner, the power cycle test apparatus comprising:

a current source for applying an electrical current to the IGBT to be tested;

a second current source connected in parallel to the IGBT to be tested;

another IGBT to be tested having collector-emitter electrodes respectively connected in series to collector-emitter electrodes of the IGBT to be tested;

an IGBT for control connected in parallel to the another IGBT to be tested; and a controller for controlling the power cycle test apparatus, wherein the controller applies the stress current to the IGBT to be tested from the current source by turning on the another IGBT to be tested and turning off the IGBT for control, and thereafter the controller applies a current for measurement from the second current source to the IGBT to be tested by turning off the another IGBT to be tested and measures a collector-emitter voltage of the IGBT to be tested, the controller applies the second current for measurement from the current source to the IGBT to be tested by turning off the another IGBT to be tested and turning on the IGBT for control and measures the collector-emitter voltage of the IGBT to be tested immediately after the application of the second current for measurement is stopped, the controller operates a junction temperature of the IGBT to be tested from the measured collector-emitter voltage and a temperature coefficient of the IGBT to be tested previously operated, the controller turns on the another IGBT to be tested to form a current application path for the stress current in the IGBT to be tested, and the controller turns off the another IGBT to be tested to block the current application path.

* * * * *